(12) United States Patent
Morita (10) Patent No.: US 10,260,996 B2
(45) Date of Patent: Apr. 16, 2019

(54) BOARD PRODUCTION MONITORING DEVICE AND BOARD PRODUCTION MONITORING METHOD

(71) Applicant: FUJI MACHINE MFG. CO., LTD., Chiryu (JP)

(72) Inventor: Yukitoshi Morita, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 3 days.

(21) Appl. No.: 15/114,285

(22) PCT Filed: Feb. 3, 2014

(86) PCT No.: PCT/JP2014/052436
§ 371 (c)(1),
(2) Date: Jul. 26, 2016

(87) PCT Pub. No.: WO2015/114828
PCT Pub. Date: Aug. 6, 2015

(65) Prior Publication Data
US 2017/0010187 A1 Jan. 12, 2017

(51) Int. Cl.
*G01M 99/00* (2011.01)
*H05K 13/08* (2006.01)
*G05B 19/418* (2006.01)

(52) U.S. Cl.
CPC ..... *G01M 99/008* (2013.01); *G05B 19/41875* (2013.01); *H05K 13/08* (2013.01); *H05K 13/083* (2018.08); *Y02P 90/22* (2015.11)

(58) Field of Classification Search
CPC .......... G01M 99/008; G05B 19/41875; G05B 19/418; H05K 13/08; B23K 31/12
See application file for complete search history.

(56) References Cited

U.S. PATENT DOCUMENTS

| 5,564,183 A * | 10/1996 | Satou ...................... B23K 31/12 29/593 |
| 2011/0218754 A1 * | 9/2011 | Mori ...................... G01B 11/00 702/108 |

FOREIGN PATENT DOCUMENTS

| CN | 102196721 | 9/2011 |
| JP | 2003-42968 A | 2/2003 |

(Continued)

OTHER PUBLICATIONS

International Search Report dated Mar. 18, 2014 in PCT/JP14/052436 Filed Feb. 3, 2014.

(Continued)

*Primary Examiner* — Manuel L Barbee
(74) *Attorney, Agent, or Firm* — Oblon, McClelland, Maier & Neustadt, L.L.P.

(57) ABSTRACT

A board production monitoring device for monitoring a production state of a board production device, including: a database section which consecutively obtains and stores production state data from the board production device; a transition graph display section which displays a transition graph showing a time-series change at least at a part of the production state data; a condition change input section which inputs condition change data which shows a change point of a production condition of the board production device and includes generation time information of the change point; and a condition change display section which displays at least the generation time information of the change point of the condition change data, at a time-series corresponding position in the transition graph, is provided.

12 Claims, 6 Drawing Sheets

(56) References Cited

FOREIGN PATENT DOCUMENTS

| JP | 2004-363312 A | 12/2004 |
|---|---|---|
| JP | 2005-327909 A | 11/2005 |
| JP | 2008-251714 A | 10/2008 |
| JP | 2009-134623 A | 6/2009 |
| JP | 2011-185638 A | 9/2011 |
| JP | 2012-33070 A | 2/2012 |
| JP | 2013-105896 A | 5/2013 |

OTHER PUBLICATIONS

Office Action dated Nov. 7, 2017 in Japanese Patent Application No. 2015-559715.
Extended European Search Report dated Mar. 1, 2017 in Patent Application No. 14880770.4.
Office Action dated May 28, 2018 in Japanese Patent Application No. 2015-559715 submitting English translation only, 6 pages.
Office Action dated Jun. 25, 2018, in Chinese Patent Application No. 201480074747.X.

\* cited by examiner

BOARD PRODUCTION MONITORING DEVICE AND BOARD PRODUCTION MONITORING METHOD

TECHNICAL FIELD

The disclosure relates to a device and a method for monitoring a production state of a board production device which produces a board on which multiple electronic components are mounted.

BACKGROUND ART

Examples of a device which produces a board on which multiple electronic components are mounted, include a solder printing device, a component mounting machine, a ref low device, and a board inspection device. In many cases, the board production devices are linked and establish a board production line. The board production device generally monitors a production state thereof, and notifies the production state to an operator in a case where the production state deteriorates. In recent years, a device which integrally monitors a plurality of board production devices that configure the board production line, or a system which monitors all of the plurality of board production lines together serving as communication means at the same time, has also been used. Technical examples of the types of board production monitoring devices are disclosed in PTL 1 and PTL 2.

A mounting line monitoring system of PTL 1 monitors a production situation (production state) of a plurality of component-mounting lines, and includes a database server and a mounting line monitoring device. The database server receives and stores data for computing at least an operating ratio, a suctioning rate, and a mounting rate of the plurality of component-mounting lines. The mounting line monitoring device can display at least the progress of the operating ratio, the suctioning rate, and the mounting rate (time-series change) on a screen in real time, and further, displays a warning when the production situation deteriorates worse than a designated reference value. According to this, since it is possible to monitor the plurality of component-mounting lines using one mounting line monitoring device, it is considered that an increase in costs of the monitoring device can be suppressed, and the monitoring is efficiently performed.

In addition, a board work supporting apparatus disclosed in PTL 2 by the applicant of the application is a device which supports work performed by a board work machine (board production device), and includes a quality determination section, an improvement procedure decision section, a procedure notification section, and a procedure completion information receiving section. In addition, the quality determination section determines a change in the work quality before and after completion of the improvement procedure by using the procedure completion as a condition. According to this, since it is possible to appropriately confirm an effect of quality improvement caused by the performed improvement procedure, a practical supporting apparatus is achieved.

CITATION LIST

Patent Literature

PTL 1: JP-A-2008-251714
PTL 2: JP-A-2013-105896

SUMMARY

However, in the technology of PTL 1, the production state of the component-mounting line is monitored and the progress thereof is displayed, but an improvement procedure method when the production state deteriorates, or a confirmation method of the effect thereof, is not disclosed. In this regard, in the technology of PTL 2, the improvement procedure is decided in a case where the work quality deteriorates, the decision is notified to the operator, and a change in the work quality before and after the completion of the improvement procedure is determined. Here, the data related to the improvement procedure performed by the operator cannot be displayed being overlapped on a transition graph showing a time-series change in the production state, in a current state. Therefore, the operator additionally records the data related to the improvement procedure, such as procedure performing time. In addition, in order to confirm the effect of the improvement procedure or the like, it is necessary that the operator compares the record of the improvement procedure and the transition graph.

However, the work of recording and comparing, is a burden to the operator since the work is troublesome and requires time and effort. In addition, since it is necessary to compare two types of data having different recording formats or display methods, there is a concern the effect of the improvement procedure is inaccurately evaluated. Therefore, when the display of the data related to the improvement procedure, such as the procedure performing time, can be displayed being overlapped on the transition graph, preferably, it is possible to reduce the burden of the operator, and to accurately confirm the effect of the improvement procedure.

Furthermore, from another point of view, the change in the production state is not limited to the improvement procedure of the operator, and can also be generated at a change point of a general production condition. For example, when performing a component replenishing work to a component feeder which is used being loaded on the component mounting machine, a suctioning success rate of a suction nozzle which is one indicator of the production state, can be changed. In addition, after replacing the suction nozzle, or after performing periodic inspection and maintenance, a case where the suctioning success rate changes can occur. When the change point of the general production condition can also be displayed being overlapped on the transition graph, it is effective in finding a cause when the production state deteriorates and deciding the improvement procedure.

Considering the problems of the technology in the background art, an object of the present disclosure is to provide a board production monitoring device and a board production monitoring method which are effective at least in any of reducing a burden of an operator by making confirmation easy, finding a cause when the production state deteriorates, deciding an improvement procedure, and confirming an effect of the performed improvement procedure, by displaying a change point of a production condition at a time-series corresponding position in a transition graph.

In order to solve the problems, the disclosure of a board production monitoring device is a board production monitoring device for monitoring a production state of a board production device which produces a board on which multiple electronic components are mounted, including: a database section which consecutively obtains and stores production state data related to the production state from the board production device; a transition graph display section which displays a transition graph showing a time-series change at least at a part of the production state data stored in the database section; a condition change input section which inputs condition change data which is condition change data showing a change point of a production condition of the board production device and includes generation time information of the change point; and a condition change display section which displays at least the generation time information of the change point of the condition change data, at a time-series corresponding position in the transition graph.

According to this, it is possible to display at least the generation time information of the change point of the production condition of the board production device, at the time-series corresponding position in the transition graph of the production state of the board production device. Therefore, unlike the related art which compares the record of the improvement procedure and the transition graph, only by checking one transition graph, the operator easily performs confirmation, and the burden of the operator is reduced. In addition, not being limited to the improvement procedure operation, since it is possible to display various change points of the production condition considered as being relevant to the production state, in the transition graph, it is effective in finding a cause when the production state deteriorates, deciding the improvement procedure operation, and confirming an effect of the performed improvement procedure operation.

In addition, the disclosure of a board production monitoring method is a board production monitoring method for monitoring a production state of a board production device which produces a board on which multiple electronic components are mounted, including: a database storage order or consecutively obtaining and storing production state data related to the production state from the board production device; a transition graph display order of displaying a transition graph showing a time-series change at least at a part of the production state data stored in the database section; a condition change input order of inputting condition change data which is condition change data showing a change point of a production condition of the board production device and includes generation time information of the change point; and a condition change display order of displaying at least the generation time information of the change point of the condition change data, at a time-series corresponding position in the transition graph.

According to this, the board production monitoring device according to the first aspect above can realize the method of the second aspect above. The method also generates effects similar to those of the board production monitoring device.

DESCRIPTION OF EMBODIMENTS

Figure 1:
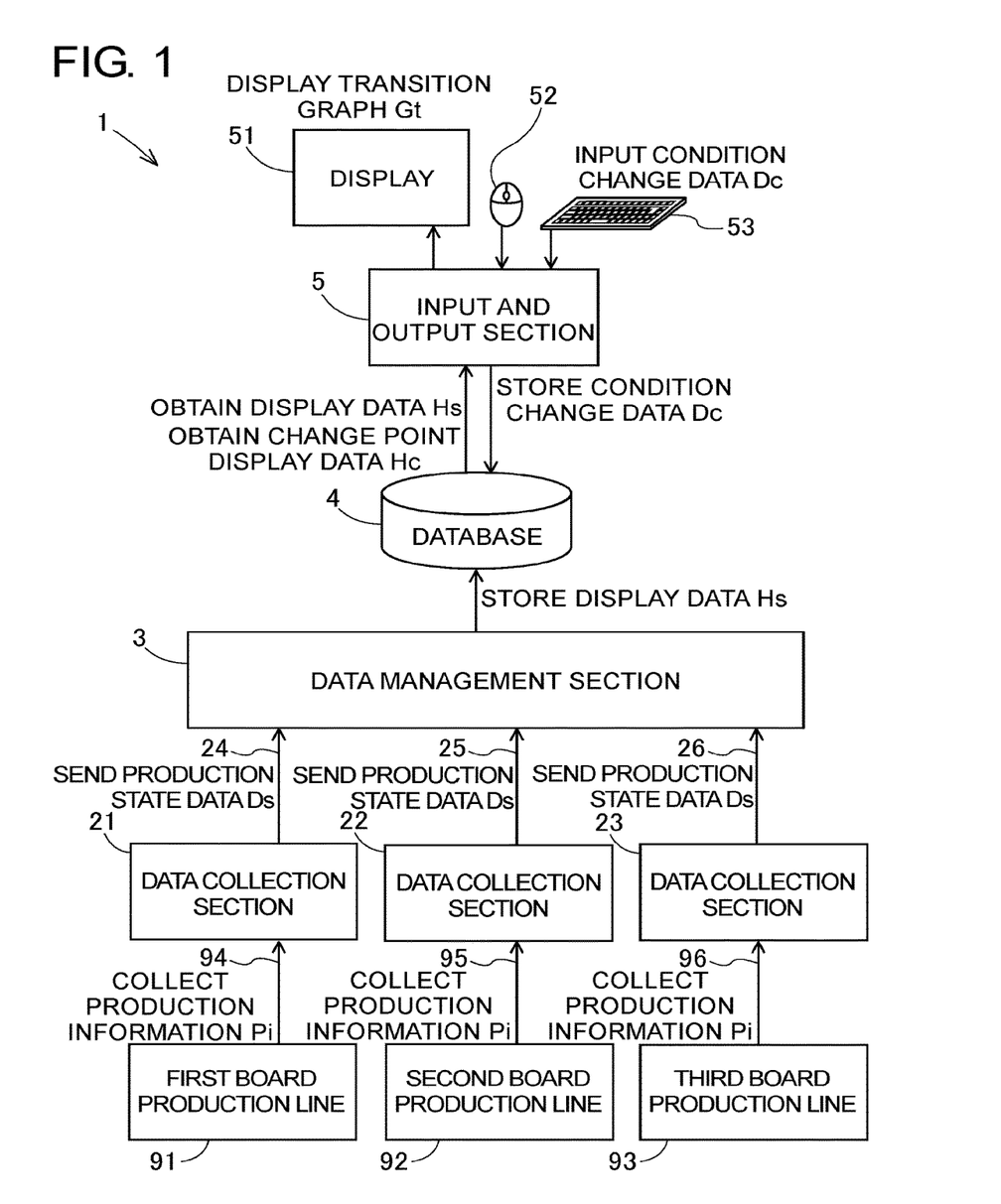
FIG. 1 is a device configuration view of a board production monitoring device of an embodiment.

A board production monitoring device 1 of an embodiment of the present disclosure will be described with reference to FIGS. 1 to 6. FIG. 1 is a device configuration view of the board production monitoring device 1 of the embodiment. In FIG. 1, an arrow which links configuration elements in the vertical direction shows a flow of information and data. As illustrated in the example of FIG. 1, first to third board production lines 91 to 93 are established in a factory. Each of the board production lines 91 to 93 is established including a component mounting machine, a solder inspection device, and a board appearance inspection device as a board production device. The board production monitoring device 1 monitors the board production devices each configuring three lines of the first to third board production lines 91 to 93, as a monitoring target. The board production monitoring device 1 is configured of data collection sections 21 to 23, data management section 3, a database 4, and an input and output section 5.

In order to grasp and manage a production state of the board production device of each of the board production lines 91 to 93, a host computer is provided in each line. Since the host computer functions as the data collection sections 21 to 23, hereinafter, the host computer will be referred to as the data collection sections 21 to 23. The data collection sections 21 to 23 and the board production devices of each of the board production lines 91 to 3, are respectively connected to each other by data lines 94 to 96. Each of the data collection sections 21 to 23 collects production information Pi (will be described later in detail) from each of the board production lines 91 to 93. The type and the number of board production devices which configure each of the board production lines 91 to 93 are not particularly limited, and various known line configurations may be employed.

The data management section 3, the database 4, and the input and output section 5 are provided as one group in the factory. The data management section 3 and each of the data collection sections 21 to 23 are connected to each other by each of communication lines 24 to 26, and wired communication is performed. The data management section 3 receives production state data Ds (will be described later in detail) sent from each of the data collection sections 21 to 23. Not being limited thereto, between the data management section 3 and each of the data collection sections 21 to 23, the production state data Ds may be sent wirelessly using a wireless sending machine and a wireless receiving machine. The database 4 stores various types of data, such as display data Hs (will be described later in detail) related to the production state of the board production device. The database 4 can be accessed from the data management section 3 and the input and output section 5 which will be described next.

The input and output section 5 includes a display 51 as an output device, and includes a mouse 52 and a keyboard 53 as input devices. The display contents of the display 51 are variably switched by the operations of the mouse 52 and the keyboard 53 of the operator. The display 51 displays at least a part of the display data Hs and change point display data Hc (will be described later in detail) in the database 4 as a transition graph Gt. The display 51 automatically performs update and display every constant update time T1 when the transition graph Gt is displayed on the screen. Condition change data Dc (will be described later in detail) input by the operator using the mouse 52 and the keyboard 53 is stored in the database 4.

Figure 2:
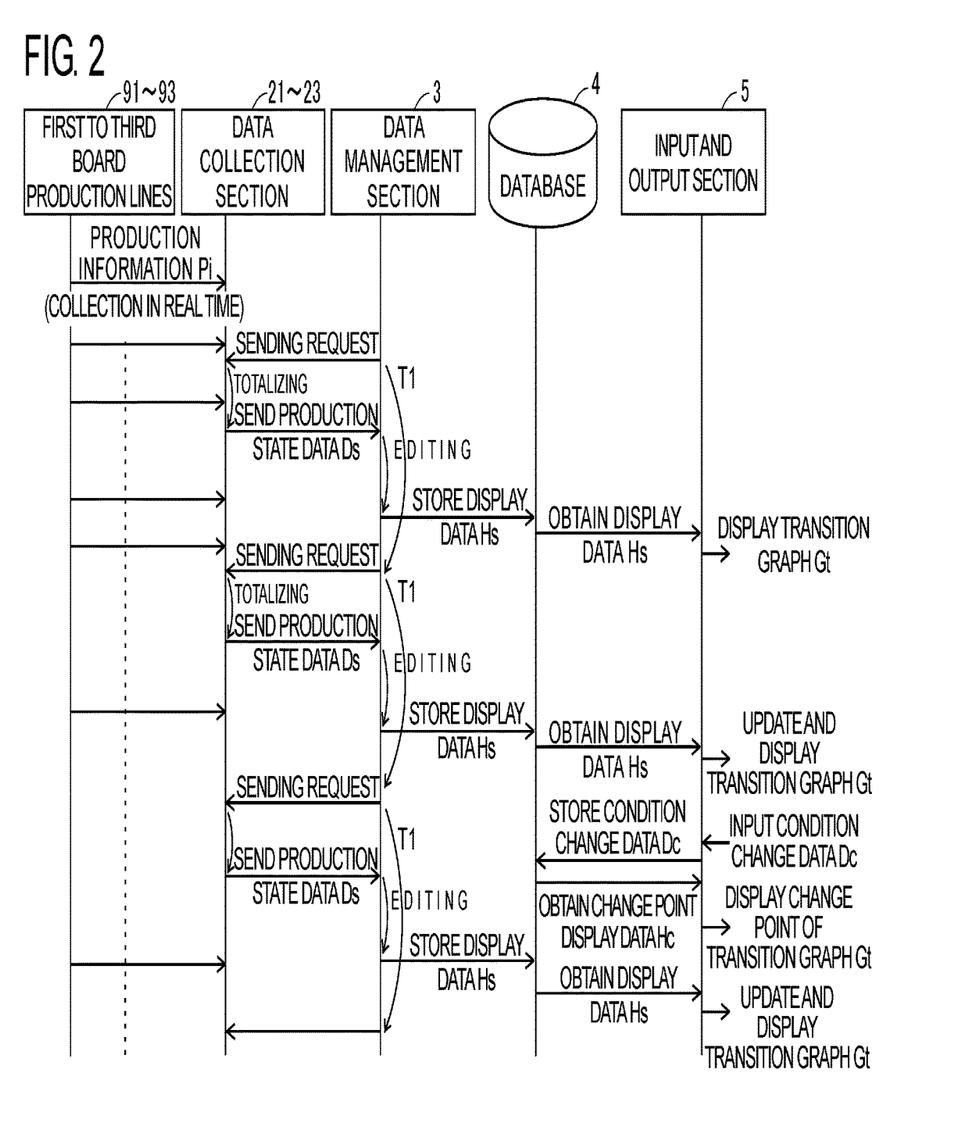
FIG. 2 is a view of a workflow illustrating a function of the board production monitoring device of the embodiment.

The types of main data handled by the board production monitoring device 1 of the embodiment are the production information Pi, the production state data Ds, the display data Hs, the condition change data Dc, the change point display data Hc, improvement procedure candidate data Kk, and procedure analysis data Sa. Hereinafter, these types of data will be described, and functions of each section of the board production monitoring device 1 will also be described. FIG. 2 is a view of a workflow illustrating a function of the board production monitoring device 1 of the embodiment. From the left side to the right side on the upper side of FIG. 2, each configuration elements 21 to 23, 3, 4, and 5 which configure the board production monitoring device 1 are illustrated being aligned. In addition, from the upper side to the lower side of FIG. 2, passage of time is illustrated. In FIG. 2, an arrow in the horizontal direction shows a flow of data and commands.

The production information Pi is information which consecutively shows the production state when each board production device is operated. Specifically, the production information Pi includes information of suctioning success or failure when a suction nozzle of the component mounting machine suctions an electronic component, information of quality of an inspection result when the solder inspection device performs inspection, and information of quality of an inspection result when the board appearance inspection device performs inspection. The production information Pi is collected by the board production lines 91 to 93 to the data collection sections 21 to 23 in real time every time each board production device is operated. The data collection sections 21 to 23 store the production information Pi collected for a constant period of time. In addition, the production information Pi is not limited to the above-described items. For example, the production information Pi also includes information of mounting success or failure illustrating whether or not the suction nozzle mounted the electronic component on the board.

The production state data Ds is data obtained by totalizing the production information Pi Specifically, the data management section 3 commands sending requests to the data collection sections 21 to 23 every constant update time T1 When the sending request is received, the data collection sections 21 to 23 create the production state data Ds totalizing the stored production information Pi by a unit of a constant editing time span T2. After this, the data collection sections 21 to 23 send the production state data Ds to the data management section 3.

As a specific example of a totalizing method, the data collection sections 21 to 23 create the production state data Ds of suctioning success rate by dividing the number of suctioning successes by the number of suctioning operations, based on the information of multiple suctioning success or failure of the suction nozzle included in the editing time span T2. In addition, the data collection sections 21 to 23 create the production state data Ds of the number of suctioning failures by counting up the number of failure of suctioning of the electronic component by the suction nozzle during the editing time span T2, and also make the details of a cause of failure into data. Furthermore, the data collection sections 21 to 23 use multiple classification methods, and perform totalization by finely dividing the suctioning success rate and the number of suctioning failures. Specifically, the data collection sections 21 to 23 totalize the suctioning success rate and the number of suctioning failures for each line of the board production lines 91 to 93. The data collection sections 21 to 23 perform classification not only for each line, but also for each suction nozzle, each mounting head which holds the suction nozzle, each slot of a component feeder, each component feeder, each component supply medium, each component type, each component lot, and each component vender (each component maker), and totalize the suctioning success rate and the number of suctioning failures.

In addition, the data collection sections 21 to 23 create the production state data Ds of a solder defect rate by dividing the number of generated defects by the number of performed inspections, based on the information of the quality of the plural inspection results of the solder inspection device included in the editing time span T2. Furthermore, the data collection sections 21 to 23 create the production state data Ds of the board appearance defect rate by dividing the number of generated defects by the number of performed inspections, based on the information of the quality of the plural inspection results of the board appearance inspection device included in the editing time span T2. The solder defect rate or the board appearance defect rate is also totalized for each line of the board production lines 91 to 93. In addition, the production state data Ds is not limited to the above-described items. For example, by totalizing the information of the above-described mounting success or failure, the production state data. Ds of the mounting success rate and the number of mounting failures may be included.

The display data Hs is data obtained by editing the production state data Ds. Specifically, the data management section 3 receives the production state data Ds responded and sent by the data collection sections 21 to 23 after commanding the sending requests to the data collection sections 21 to 23. After this, the data management section 3 creates the display data Hs which can be displayed on the display 51 by editing the production state data Ds, and stores the data in the database 4. The display data Hs is obtained by the input and output section 5 every time being stored in the database 4. Accordingly, the transition graph Gt which shows a time-series change at least at a part of the production state data Ds is displayed on the screen of the display 51.

The condition change data Dc is data which shows a change point of a production condition of the board production device. The condition change data Dc can be input by the operation by the operator using the mouse 52 and the keyboard 53. The input condition change data Dc is stored in the database 4. Not being limited thereto, the board production lines 91 to 93 autonomously may detect the change point of the production condition, and may store the condition change data Dc in the database 4 online via the data collection sections 21 to 23. For example, the component feeder of the component mounting machine has a communication function, and can configure the board production lines 91 to 93 so as to send an individual recognition code to the data collection sections 21 to 23. In this configuration, the change point of the production condition, such as replacement of the component feeder, can be automatically input online without the input operation of the operator.

Specific examples of the change point, of the production condition include a component replenishing operation by the operator in the component mounting machine, a periodic examination by a maintenance person, maintenance, or a replacing operation of a part of members starting from a mounting nozzle. In addition, when the production state data Ds deteriorates, the improvement procedure operation which is performed by the operator for improving the production state is also included in the change point of the production condition. For example, in the component mounting machine, replacing the suction nozzle when the suctioning success rate deteriorates, or changing the setting of the suctioning operation condition, corresponds to the change point of the production condition. In addition, for example, in the solder inspection device or the board appearance inspection device, correcting an image processing method of an inspection image when the defect rate increases, or changing an imaging region, corresponds to the change point of the production condition. Furthermore, alternation of the operator who is in charge of production management work, such as the component replenishing operation, temporary electric power failure of a power source of the board production device, or occurrence of earthquake, is considered as the change point of the production condition.

Here, a data format of the condition change data Dc includes at least generation time information of change point. In a case where the change point of the production condition is caused by the operation of the operator, the information of finish time of the operation is used as the generation time information. Furthermore, it is preferable that the condition change data Dc has a data format including name of an involved operator or the content of the change in the production condition.

The change point display data Hc is data obtained by editing the condition change data Dc, and is data displayed overlapping the change point of the production state on the transition graph Gt. The change point display data Hc is obtained from the database 4 to the input and output section 5. Accordingly, at least the generation time information of the change point of the condition change data Dc is displayed being overlapped at the time-series corresponding position in the transition graph Gt on the display 51. Furthermore, it is preferable that the name of the involved operator or the content of the change in the production condition is also displayed on the display 51.

The improvement procedure candidate data Kk is data which shows a candidate of the improvement procedure operation to be performed by the operator when the production state deteriorates. The improvement procedure candidate data Kk is created in association with the candidate of the improvement procedure operation for each target event in which the production state deteriorates in each board production device. The improvement procedure candidate data Kk is created by a technical expert in advance, and is stored in the database 4. The improvement procedure candidate data Kk is displayed being overlapped on the transition graph Gt on the screen of the display 51 by a specific operation of the mouse 52 and the keyboard 53.

The procedure analysis data Sa is data made by analyzing effectiveness the improvement procedure operation performed by the operator. The procedure analysis data Sa is created by the data management section 3, based on a relationship between the condition change data Dc which shows the improvement, procedure operation, and the transition graph Gt including a time slot before and after the generation time information of the change point of the condition change data Dc. The procedure analysis data Sa is displayed being separated from the transition graph. Gt on the screen of the display 51 by a specific operation of the mouse 52 and the keyboard 53.

Figure 3:
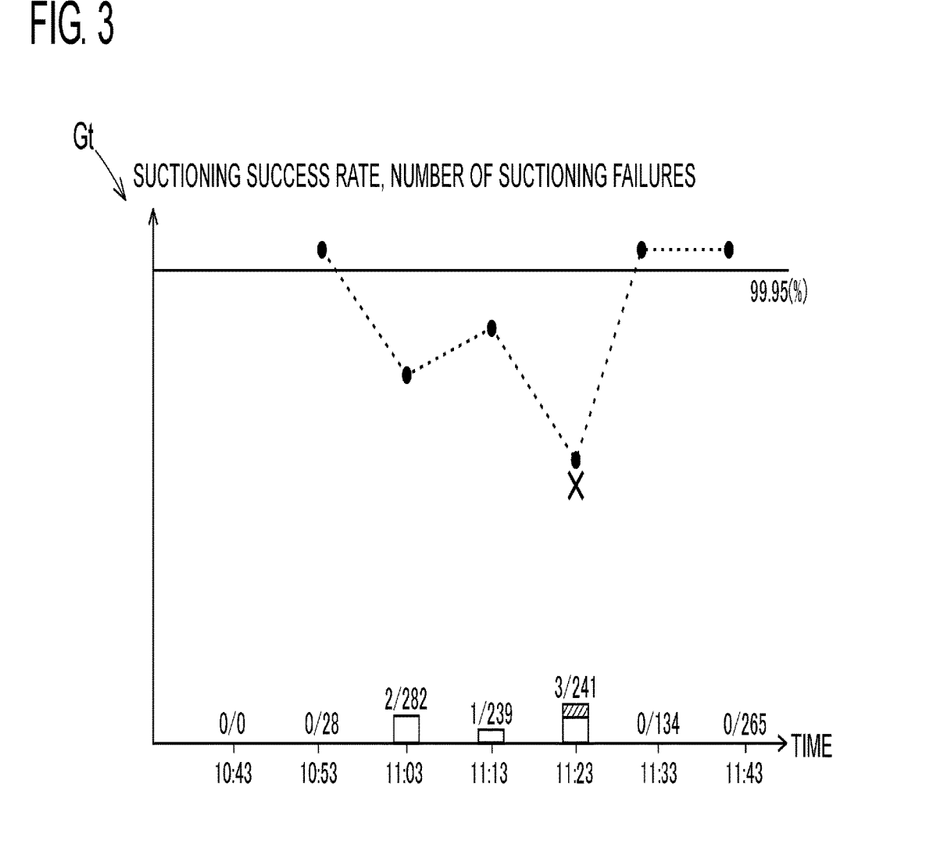
FIG. 3 is a view illustrating an example of a transition graph displayed on a screen of a display.

Next, an operation and an action of the board production monitoring device 1 of the embodiment, will be described with reference to an example of the display screen of the display 51. FIG. 3 is a view illustrating an example of the transition graph Gt displayed on the screen of the display 51. A horizontal axis of FIG. 3 illustrates time shown in exact time and minute, and the vertical axis illustrates the suctioning success rate and the number of suctioning failures which are production state of the component mounting machine of a certain board production line. In addition, the horizontal axis may be passage of time from the start of the board production of the board production lines 91 to 93. Black dots linked by a dotted line in the transition graph Gt show the time-series change in the suctioning success rate. A bar graph in the transition graph Gt shows the time-series change in the number of suctioning failures. Furthermore, a fraction value displayed on the bar graph illustrates the number of suctioning failures in numerator, and the number of suctioning operations is illustrated in denominator.

The transition graph Gt displays the display data Hs in the past 7 times (divided in 7 columns), by setting the constant editing time span T2 to 10 minutes, and by totalizing and editing the production state data Ds, in this manner, by setting, totalizing, and editing the editing time span T2, the transition graph Gt becomes easy to be checked, and a burden of the operator decreases. In the example of FIG. 3, for minutes from 10:33 to 10:43, the suction nozzle of the component mounting machine does not perform the suctioning operation even once. Therefore, the black dot which shows the suctioning success rate is not displayed in the column of "10:43," the bar graph which shows the number of suctioning failures is also not displayed, and only a fraction value "0/0" is displayed. After this, at approximately 10:50, the production of the board by the component mounting machine is started. Then, for minutes from 10:43 to 10:53, the suction nozzle of the component mounting machine performs the suctioning operation 28 times, and all of the suctioning operation are successful. Therefore, the black dot which shows the suctioning success rate of 100% is displayed in the column of "10:53," the bar graph which shows the number of suctioning failures, is not displayed, and the fraction value "0/28" is displayed.

Similarly, for 10 minutes from 10:53 to 11:03, the suction nozzle performs the suctioning operation 282 times, and the operation fails only twice. Therefore, the black dot which shows the suctioning success rate of 99.29% (=280/282) is displayed in the column of "11:03," the bar graph which shows that the number of suctioning failures is 2, is displayed, and the fraction value "2/282" is displayed. Furthermore, similarly, the black dot which shows the suctioning success rate of 99.58% (=238/239) is displayed in the column of "11:13," the bar graph which shows that the number of suctioning failures is 1, is displayed, and the fraction value "1/239" is displayed. Furthermore, similarly, the black dot which shows the suctioning success rate of 98.75% (=238/241) is displayed in the column of "11:23," the bar graph which shows that the number of suctioning failures is 3, is displayed, and the fraction value "3/241" is displayed. The bar graph which shows that the number of suctioning failures is 3, is pattern-divided to a diagonal line display section and a white-blanking display section, and the details of the cause of the failure omitted in the drawing is displayed. Hereinafter, the column "11:33" and the column. "11:43" are also similarly displayed. In addition, in the transition graph Gt, a reference line is displayed in a level of 99.95% which is a standard of an excellent suctioning success rate.

Figure 4:
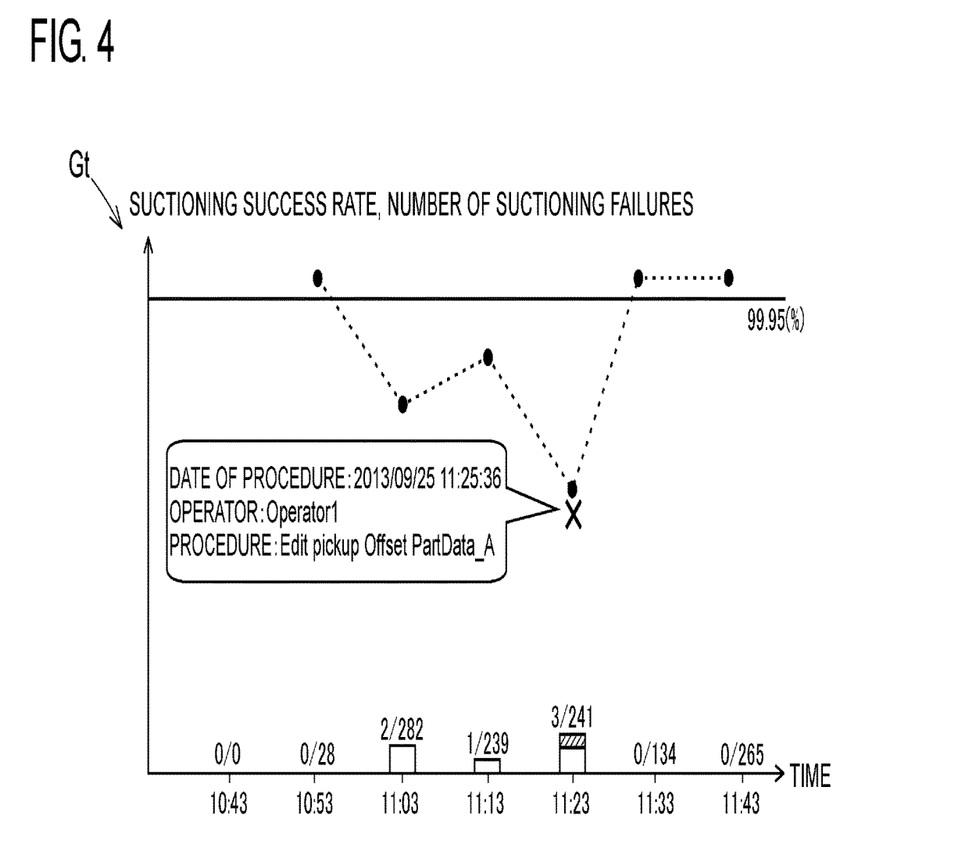
FIG. 4 is a view illustrating an example of the content of a change point of a production condition displayed being overlapped on the transition graph.

Here, under the black dot of the column "11:23," a X mark X mark in bold which shows the change point of the production condition is overlapped and displayed. However, the content of specific change point cannot be understood only by the X mark. Here, when the operator makes a pointer of the mouse 52 approach the X mark on the display screen of the display 51, as illustrated in FIG. 4, the content of the change point is pop-up displayed. FIG. 4 is a view illustrating an example of the content of the change point of the production condition displayed being overlapped in the transition graph Gt. In FIG. 4, as a change point of the production condition, the improvement procedure operation performed by the operator is illustrated.

The content of the improvement procedure operation which is pop-up displayed is based on the change point display data Hc, and made of 3 columns, such as the date of the procedure, the operator, and the procedure. The column of the date of the procedure is displayed as "2013/09/25 11:25:36," and information of the finish time of the improvement procedure operation is shown. In the embodiment, as the time-series corresponding position of the finish time, the X mark which shows the change point of the production condition is overlapped and displayed in the immediately previous column "11:23." Not being limited thereto, between the column "11:23" and the next column "11:33," the X mark which shows the change point of the production condition may be displayed. The column of the operator is displayed as "Operator 1," and shows information of the name of the operator who performed the improvement procedure operation. The column of procedure is displayed as "Edit pickup Offset PartData_A" and shows the content of the improvement procedure operation. Specifically, the column means that the setting of the suctioning operation condition is changed when the electronic component of a component type A is suctioned.

In the example of FIG. 4, the improvement procedure operation of changing the setting of the suctioning operation condition is finished at 11:25:36, and the operator has already input the content as the condition change data Dc. Accordingly, by the display of the next column "11:33," the suctioning success rate is improved to 100%. In this manner, the content of performing the improvement procedure operation and the result thereof can be easily and accurately confirmed only by checking the transition graph Gt. In addition, the content of the improvement procedure operation may be displayed by a method other than the pop-up display. For example, the transition graph Gt may be displayed on the upper side of the screen of the display 51, and the content of the improvement procedure operation may be displayed on the lower side of the same screen. In addition, for example, a Multi-window function of a general-purpose computer can be used.

As the change point of the production condition, an operation other than the improvement procedure operation may be employed. For example, the component replenishing operation of supplying the components to the component feeder by the operator also can be displayed being overlapped on the transition graph Gt by inputting the condition change data Dc. Furthermore, other than the component replenishing operation, various change points of the production condition which are considered to be associated with the production state, can be displayed being overlapped on the transition graph Gt. In this case, since the change point is a different type from the improvement procedure operation, for example, by the change point is displayed by using a triangle mark or a square mark, it become easy to distinguish the type of the change point.

When the transition graph Gt is displayed and the constant update time T1 passes, the transition graph Gt is automatically updated and displayed. For example, in a case where the update time T1 is set to be 3 minutes, the display data Hs is edited again at 11:46 which is 3 minutes after the most updated column. "11:43." Accordingly, the transition graph Gt is updated and displayed to 7 columns from a column "10:46" made by totalizing the time period from 10:36 to 10:46, to a column "11:46" made by totalizing the time period from 11:36 to 11:46.

In the above description, the update time T1 (=3 minutes) is set to be shorter than the editing time span T2 (=10 minutes). Here, when the editing time span T2 is set to be a certain long time period and the number of suctioning operations is set to an appropriate number, it is preferable that the transition graph Gt becomes easy to be checked. The extremely small number of suctioning operations which becomes a population parameter is not preferable since accuracy of the suctioning success rate becomes low, and the transition graph Gt becomes unlikely to be checked. Meanwhile, it is preferable that the update time T1 is short so that the presence or the absence of the influence of the change point of the production condition or the effect of the improvement procedure operation is rapidly confirmed. Therefore, the board production monitoring device 1 is configured so that the editing time span T2 and the update time T1 obtain values different from each other. Furthermore, it is preferable that the editing time span T2 and the update time T1 are set to be independently variable.

Figure 5:
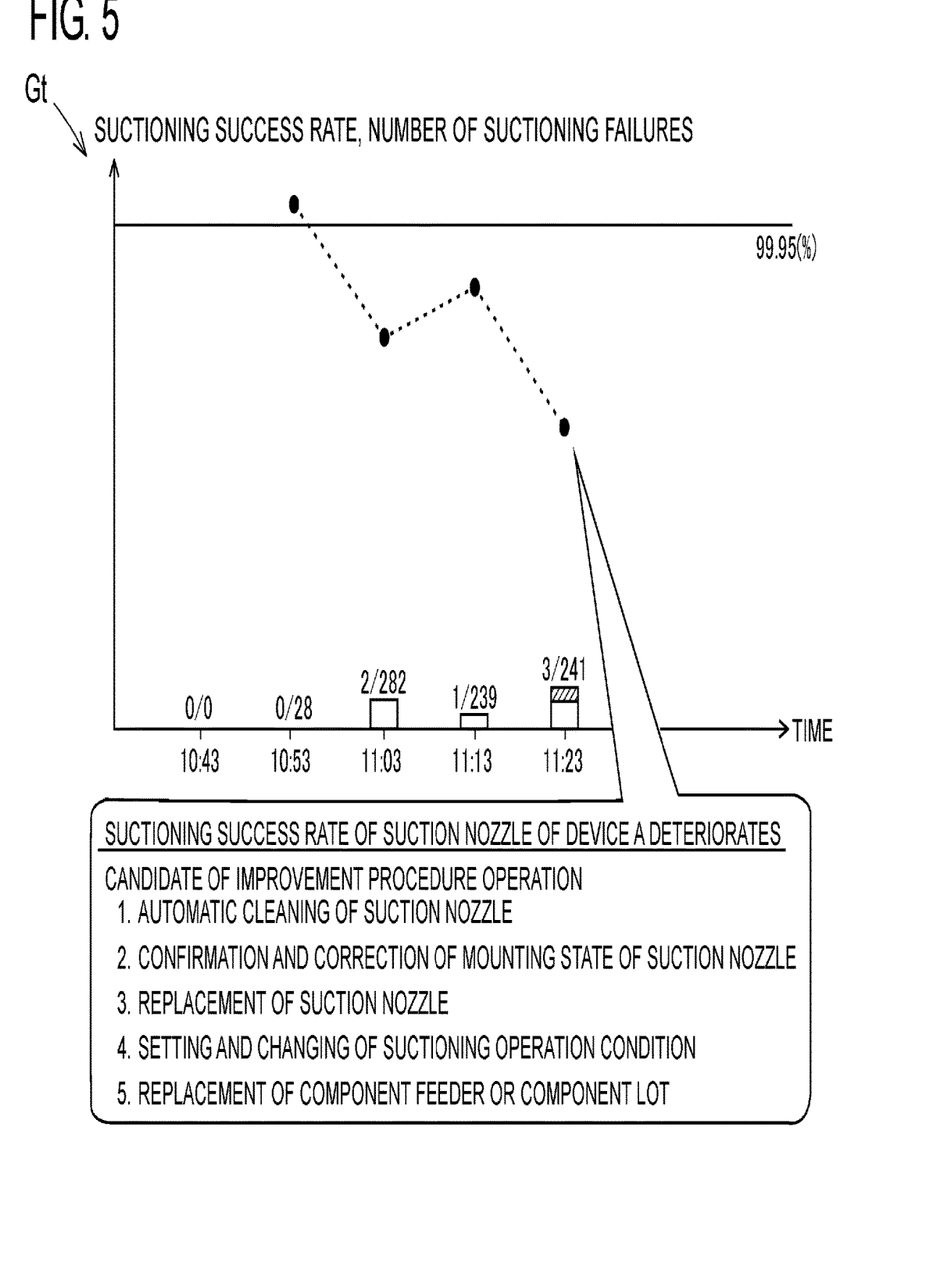
FIG. 5 is a view illustrating an example of a screen on which a candidate of an improvement procedure operation is pop-up displayed on the transition graph, by a function of a measure presentation section.

Next, a function of a measure presentation section which presents the candidate of the improvement procedure operation on the display 51, will be described. FIG. 5 is a view illustrating an example of the screen on which the candidate of the improvement procedure operation is pop-up displayed on the transition graph Gt, by the function of the measure presentation section. The transition graph Gt illustrated as an example in FIG. 5 is a graph at a time point 11:23 which goes back from FIGS. 3 and 4 in time. When the operator makes the pointer of the mouse 52 approach the black dot which shows the suctioning success rate deteriorated in the column "11:23" of the transition graph Gt, as illustrated in FIG. 5, the candidate of the improvement procedure operation is pop-up displayed.

The content which is pop-up displayed is made of 2 columns, such as the deterioration situation of the production state and the candidate of the improvement, procedure operation. The deterioration situation of the production state is displayed as "the suctioning success rate of the suction nozzle of a device A deteriorates." As the candidate of the improvement procedure operation, 5 candidates are displayed based on the improvement procedure candidate data Kk. For example, the first candidate is "1. automatic cleaning of the suction nozzle," and a second candidate is "2. confirmation and correction of the mounting state of the suction nozzle." The operator can perform an appropriate improvement procedure operation with reference to the transition graph Gt and 5 candidates of the improvement procedure operation.

Figure 6:
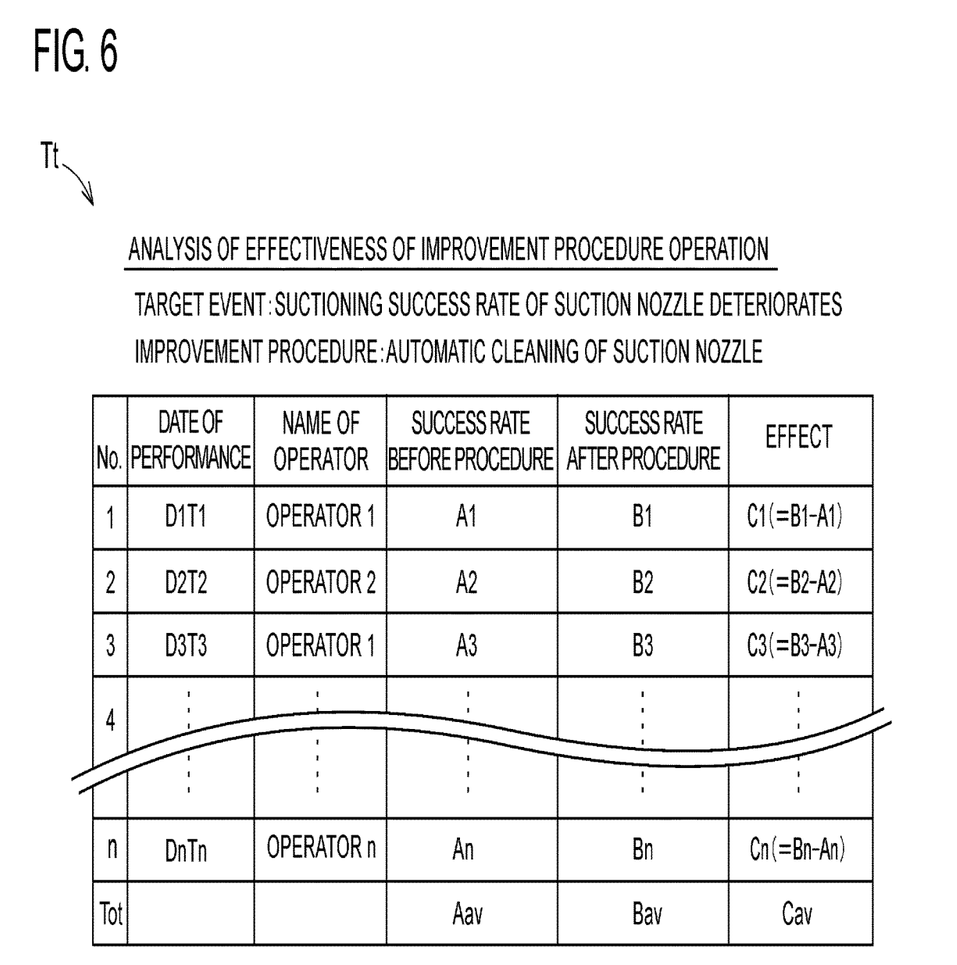
FIG. 6 is a view of an analysis table illustrating an example of a function of a procedure analysis section.

Next, a function of a procedure analysis section which presents the analysis result of effectiveness of the improvement procedure operation on the display 51, will be described. FIG. 6 is a view of an analysis table Tt which illustrates an example of the function of the procedure analysis section. The analysis table Tt of FIG. 6 is displayed being separated from the transition graph Gt on the screen of the display 51. The analysis table Tt summarizes cases where the target event, in which the production state deteriorates and the method of the performed improvement procedure operation are the same based on the procedure analysis data Sa and shows the cases as a list. In FIG. 6, a case which is performed by considering "deterioration of the suctioning success rate of the suction nozzle" as the target event, and "automatic cleaning of the suction nozzle" as the improvement procedure operation, is illustrated as an example.

In the analysis table Tt of FIG. 6, the columns of the consecutive numbers from the left side to the right side of the table (No.), the name of the operator, a success rate before the procedure, a success rate after the procedure, and the effects, are provided. In addition, from the upper step to the lower step of the table, n cases are arranged, and the total column Tot is provided at the lowest step. The formats of the data of each step are unified into one format. For example, the data of the consecutive number No. 1 illustrates that the date of generation is D1T1, and the operator who performed the improvement procedure operation is an operator 1. In addition, two values, such as a success rate before the procedure A1 and a success rate after the procedure B1 at this time are values displayed in the transition graph Gt. Furthermore, an effect C1 of the improvement procedure operation is acquired by subtracting the success rate before the procedure A1 from the success rate after the procedure B1.

Similar analysis is performed with respect to the cases each step. Next, as an average of the total n cases, an average value Aav of the success rates before the procedure A1 to An, an average value Bav of the success rates after the procedure B1 to Bn, and an average values Cav of the effects C1 to Cn, are respectively computed, and displayed in the total column Tot. The operator can accurately evaluate the effect of the improvement procedure operation while checking the analysis table Tt. In addition, the analysis method and the display method of the effect of the improvement procedure operation may be a method other than the above-described methods. For example, by using a general-purpose graphic function, the change in the production state before and after performing the improvement procedure operation may be displayed.

As described above, since the data collection sections 21 to 23 and the data management section 3 of the embodiment edit the production state data Ds by a unit of the constant editing time span T2 for each constant update time T1, create the display data Hs, and store the data in the database 4, the function of the database section and the function of the data editing section of the present disclosure are provided. In addition, since the database 4 and the display 51 of the input and output section 5 display the transition graph Gt on the screen based on the display data Hs, database 4 and the display 51 of the input and output section 5 are provided with the function of the transition graph display section of the present disclosure. Furthermore, since the database 4 and the display 51 display at least generation time information of the change point of the change point display data Hc at the time-series corresponding position in the transition graph Gt, database 4 and the display 51 are provided with the function of the condition change display section of the present disclosure. In addition, the mouse 52 and the keyboard 53 of the input and output section 5 are provided with the function of the condition change input section of the present disclosure.

The board production monitoring device 1 of the embodiment is a board production monitoring device for monitoring the production state of the board production device in the board production lines 91 to 93 which produces the board, and includes: the database section which consecutively obtains and stores the production state data Ds related to the production state from the board production device; the transition graph display section which displays the transition graph Gt showing the time-series change at least at a part of the production state data Ds stored in the database section; the condition change input section which inputs the condition change data Dc which is the condition change data Dc showing the change point of the production condition of the board production device and includes the generation time information of the change point; and the condition change display section which displays at least the generation time information of the change point of the condition change data Dc, at the time-series corresponding position in the transition graph Gt.

According to this, it is possible to display at least the generation time information of the change point of the production condition of the board generation device, at the time-series corresponding position in the transition graph Gt of the production state of the board production device. Therefore, unlike the technology in the related art in which the record of the improvement procedure and the transition graph are compared, only by checking one transition graph. Gt the operator easily performs confirmation, and the burden of the operator is reduced. In addition, not being limited to the improvement procedure operation, it is possible to display various change points of the production condition considered as being relevant to the production state, in the transition graph Gt, it is effective in finding a cause when the production state deteriorates, deciding the improvement procedure operation, and confirming an effect of the performed improvement procedure operation.

Furthermore, the board production monitoring device of the embodiment includes an operation of the operator at the change point of the production condition of the board production device, and uses the information of the finish time of the operation as the generation time information of the change point. According to this, it is possible to make a cause-and-effect relationship between the operation of the operator and the change in the production state apparent. Therefore, it is effective in finding the causes of a case where the production state deteriorates.

Furthermore, in the board production monitoring device 1 of the embodiment, the operation of the operator includes the improvement, procedure operation which is performed for improving the production state with reference to the time-series deterioration of the production state data shown in the transition graph Gt. According to this, it is possible to make the cause-and-effect relationship between the improvement procedure operation of the operator and the improvement level of the production state apparent. Therefore, it is effective in confirming the effect of the improvement procedure performed when the production state deteriorates.

Furthermore, the board production monitoring device 1 of the embodiment is further provided with the measure presentation section which presents the candidate of the improvement, procedure operation based on time-series deterioration of the production state data. According to this, since the strong candidate of the improvement procedure operation when the production state deteriorates is presented, the operator can correctly and rapidly decide the improvement procedure operation.

Furthermore, the board production monitoring device of the embodiment is further provided with the procedure analysis section which analyzes the effectiveness of the improvement procedure operation, based on the relationship between the condition change data Dc when the operator performs the improvement procedure operation, and the transition graph Gt including the time slot before and after the generation time information of the change point of the condition change data Dc. According to this, since the past improvement procedure operation is analyzed and made as data, it is effective in finding the cause of a case where the production state deteriorates, and in deciding the improvement procedure.

Furthermore, the board production monitoring device 1 of the embodiment is further provided with the data editing section which creates the display data Hs by editing the production state data Ds by a unit of the constant editing time span T2 every constant update time T1, and the transition graph display section updates and displays the transition graph Gt based on the display data Hs every constant update time T1. According to this, since the transition graph Gt is easily checked by the editing, and the operation for updating the transition graph Gt is not necessary, the burden of the operator is reduced.

Furthermore, in the board production monitoring device 1 of the embodiment, the update time T1 is shorter than the editing time span T2. According to this, the transition graph Gt becomes easy to be checked, the burden of the operator is reduced, and the effect of the improvement procedure operation can be rapidly confirmed.

Furthermore, the board production monitoring device 1 of the embodiment can be realized as the disclosure of the board production monitoring method. In the disclosure of the board production monitoring method, effects similar to those of the disclosure of the board production monitoring device 1, are also generated.

In addition, the solder printing device or the reflow device included in the first to third board production lines 91 to 93, can be added to the monitoring target. Conversely, as a small device configuration, only one component mounting machine may be a monitoring target. The present disclosure can be modified or applied in various manners.

REFERENCE SIGNS LIST

1: board production monitoring device, 21 to 23: data collection section, 3: data management section, 4: database, 5: input and output section, 51: display, 52: mouse, 53: keyboard, 91 to 93: first to third board production lines (plurality of board production devices), Pi: production information, Ds: production state data, Hs: display data, Dc: condition change data, Hc: change point display data, Gt: transition graph, Tt: analysis table

The invention claimed is:

1. A board production monitoring device for monitoring a production state of a board production device which produces a board on which multiple electronic components are mounted, the board production monitoring device comprising:
a database section which consecutively obtains and stores production state data related to the production state from the board production device;
a transition graph display section which displays a transition graph showing a time-series change at least at a part of the production state data stored in the database section;
a condition change input section which inputs condition change data which is data showing a change point of a production condition of the board production device and includes generation time information of the change point, the generation time information corresponding a time after which the change point of the production condition affects all boards produced by the board production device; and
a condition change display section which displays at least the generation time information of the change point of the condition change data, at a time-series corresponding position in the transition graph.

2. The board production monitoring device according to claim 1,
wherein an operation of an operator is included in the change point of the production condition of the board production device, and information of finish time of the operation is used as the generation time information of the change point.

3. The board production monitoring device according to claim 2,
wherein the operation of the operator includes an improvement procedure operation performed for improving the production state with reference to time-series deterioration of the production state data shown in the transition graph.

4. The board production monitoring device according to claim 3, further comprising:
a measure presentation section which presents a candidate of the improvement procedure operation based on time-series deterioration of the production state data.

5. The board production monitoring device according to claim 3, further comprising:
a procedure analysis section which analyzes effectiveness of the improvement procedure operation, based on a relationship between the condition change data when the operator performs the improvement procedure operation, and the transition graph including a time slot before and after the generation time information of the change point of the condition change data.

6. The board production monitoring device according to claim 1, further comprising:
a data editing section which creates display data by editing the production state data by a unit of a constant editing time span every constant update time,
wherein the transition graph display section updates and displays the transition graph based on the display data every constant update time.

7. The board production monitoring device according to claim 6,
wherein the update time is set to be shorter than the editing time span.

8. The board production monitoring device according to claim 1,
wherein the board production device includes any of a component mounting machine which suctions electronic components by a suction nozzle and mounts the electronic components on a board, a solder inspection device which inspects a state of a paste-like solder printed on the board, and a board appearance inspection device which detects appearance of the board on which the electronic components are mounted, and
wherein the production state data includes any of a suctioning success rate of success of suctioning of the electronic components by the suction nozzle of the component mounting machine, a defect rate when the solder inspection device performs inspection, and a defect rate when the board appearance inspection device performs the inspection.

9. The board production monitoring device according to claim 1, wherein the condition change input section includes a mouse and/or a keyboard.

10. A board production monitoring method for monitoring a production state of a board production device which produces a board on which multiple electronic components are mounted, the method comprising:

consecutively obtaining and storing production state data related to the production state from the board production device;

displaying a transition graph showing a time-series change at least at a part of the production state data stored in a database section;

inputting condition change data which is data showing a change point of a production condition of the board production device and includes generation time information of the change point, the generation time information corresponding a time after which the change point of the production condition affects all boards produced by the board production device; and     displaying at least the generation time information of the change point of the condition change data, at a time-series corresponding position in the transition graph.

11. The method of claim 10, further comprising inputting condition change data using a mouse and/or a keyboard.

12. A board production monitoring device for monitoring a production state of a board production device which produces a board on which multiple electronic components are mounted, the board production monitoring device comprising:

a controller;

a memory which consecutively obtains and stores production state data related to the production state from the board production device;

a display which displays a transition graph showing a time-series change at least at a part of the production state data stored in the memory     an input device which inputs to the controller condition change data which is data showing a change point of a production condition of the board production device and includes generation time information of the change point, the generation time information corresponding a time after which the change point of the production condition affects all boards produced by the board production device; and     wherein, after the condition change data is input, the display displays at least the generation time information of the change point of the condition change data, at a time-series corresponding position in the transition graph.

\* \* \* \* \*

UNITED STATES PATENT AND TRADEMARK OFFICE
CERTIFICATE OF CORRECTION

| | | |
|---|---|---|
| PATENT NO. | : 10,260,996 B2 | Page 1 of 1 |
| APPLICATION NO. | : 15/114285 | |
| DATED | : April 16, 2019 | |
| INVENTOR(S) | : Yukitoshi Morita | |

It is certified that error appears in the above-identified patent and that said Letters Patent is hereby corrected as shown below:

On the Title Page

Item (71), should read:
--FUJI CORPORATION, Chiryu (JP)--

Signed and Sealed this
Twenty-eighth Day of April, 2020

Andrei Iancu
*Director of the United States Patent and Trademark Office*